United States Patent [19]

Takata et al.

[11] Patent Number: 5,563,844
[45] Date of Patent: Oct. 8, 1996

[54] ARCHITECTURE FOR ACCESSING VERY HIGH DENSITY MEMORY DEVICE

[75] Inventors: Akira Takata; Tetsuo Hikawa; Takashi Sawada, all of Kobe, Japan; Tom Dang-hsing Yiu, 793 Los Positos Dr., Milpitas, Calif. 95035; Ful-Long Ni, San Jose, Calif.

[73] Assignees: Mega Chips Corporation, Suita, Japan; Tom Dang-hsing Yiu, Milpitas, Calif.

[21] Appl. No.: 411,983

[22] Filed: Mar. 28, 1995

[30] Foreign Application Priority Data

Apr. 28, 1994 [JP] Japan .................... 6-091990

[51] Int. Cl.$^6$ .................................. G11C 8/00
[52] U.S. Cl. ............... 365/233.5; 365/230.01; 365/230.08; 365/236; 365/94
[58] Field of Search ............. 365/94, 230.01, 365/233.5, 236, 230.08

[56] References Cited

U.S. PATENT DOCUMENTS

| | | | |
|---|---|---|---|
| 5,303,201 | 4/1994 | Sakamoto | 365/230.01 |
| 5,392,239 | 2/1995 | Margulis et al. | 365/230.01 |

Primary Examiner—David C. Nelms
Assistant Examiner—F. Niranjan
Attorney, Agent, or Firm—Oblon, Spivak, McClelland, Maier & Neustadt, P.C.

[57] ABSTRACT

In order to improve area efficiency of a mask ROM, a head address is inputted from a common pad (204) only in an initial access, so that addresses are thereafter changed by an internal counter (212). Data output is carried out through the common pad (204). Wires are employed for address input and data output in common, thereby remarkably reducing the number of wires.

3 Claims, 15 Drawing Sheets

F I G. 5

| ITEM | SYMBOL | MINIMUM | MAXIMUM | UNIT |
|---|---|---|---|---|
| ADDRESS SETUP TIME | tAS | 15 | | ns |
| ADDRESS HOLD TIME | tAH | 5 | | ns |
| LATENCY TIME (ALEL to RD) /SECTOR SEQUENTIAL ACCESS/CE to RD) | tL | 2 | | μs |
| IN-SECTOR READ CYCLE TIME | tCYC | 400 | | ns |
| ACCESS TIME | tRD | | 70 | ns |

FIG. 7

|  | SECTOR ACCESS | IN-SECTOR ACCESS |
|---|---|---|
| CASE 1 | ~300 msec | ~13.4 μsec |
| CASE 2 | ~2 μsec | ~0.5 μsec |

ARCHITECTURE FOR ACCESSING VERY HIGH DENSITY MEMORY DEVICE

BACKGROUND OF THE INVENTION

1. Field of the Invention

The present invention relates to a semiconductor memory device such as a mass storage mask ROM.

2. Background of the Invention

As to a mask ROM (semiconductor memory) which is regarded as a semiconductor memory device of first prior art having the highest degree of integration, that of 16 megabits is mass-produced while that of 32 megabits is in a stage of completion of a sample and that of 64 megabits is still in the process of development at this stage. While a CDROM (second prior art) has been developed as a mass storage device, the CDROM is disadvantageously slow in data access speed as compared with the mask ROM. Further, a mechanism such as a motor is required in the system as a driver for the CDROM, and hence the overall system is disadvantageously increased in size. Thus, the cost for the system is increased in response, and reliability in data access itself is reduced as compared with the mask ROM if the motor or the like is deteriorated in accuracy. In view of such disadvantages, it is preferable to consider employment of the mask ROM in place of the CDROM.

FIG. 11 schematically shows a memory cell block structure of a semiconductor memory device according to the first prior art. In the semiconductor memory device of the first prior art, the interior of a memory cell array 51 is divided into a plurality of memory cell array blocks 52 to 55, in order to attain a high speed. Therefore, memory cell array block selecting circuits 56 are provided in correspondence to the respective memory cell array blocks 52 to 55. In the semiconductor memory device of at least 16 megabits according to the first prior art, further, a plurality of memory cell arrays 51 are arranged in parallel with each other and word line decoding circuits 61 are provided for the respective memory cell arrays 51 for attaining a high speed, as shown in FIG. 12.

FIG. 13 illustrates the block structure of the semiconductor memory device according to the first prior art. Referring to FIG. 13, numeral 62 denotes a word line predecoding circuit, numeral 63 denotes a bit line decoding circuit, numeral 64 denotes a bit line predecoding circuit, and numeral 65 denotes a sense circuit respectively. Further, FIG. 14 illustrates the structure of input/output pins provided in the semiconductor memory device according to the first prior art. Referring to FIG. 14, numeral 71 denotes a chip comprising the memory cell arrays 51 and peripheral circuits such as the sense circuit 65, symbols A0 to A21 denote address input pins, symbols D0 to D15 denote data output pins, symbol/OE denotes an output enable signal input pin, symbol/CE denotes a chip enable signal input pin, symbol Vcc denotes a power supply pin, and symbol GND denotes a ground connection pin respectively.

When a chip enable signal which is inputted in the chip enable signal input pin/CE goes low in operation of the semiconductor memory device according to the first prior art as shown in FIG. 15, a word line and a bit line are selected in accordance with address information which is inputted in any of the address input pins A0 to A21 as an address input signal, so that any memory cell in the memory cell arrays 51 is accessed. Data of the memory cell as accessed is outputted from any of the data output pins D0 to D15 slightly after an output enable signal which is inputted in the output enable signal input pin/OE goes low.

Properties of the mask ROM according to the first prior art and the CDROM according to the second prior art are as follows:

Although the mask ROM (first prior art) is at a high speed, the cost therefor is increased.

Although the CDROM (second prior art) is at a low cost and has mass storage, the same is at a low speed. In formation of a system, further, the overall system is increased in size. In addition, a driving system for the CDROM is at a high cost.

When employment of a mask ROM is considered as substitution for a CDROM as hereinabove described, therefore, a number of memory cell arrays 51 are required as shown in FIG. 13 for attaining a function which is equivalent to that of the CDROM, since the capacity of each memory cell array 51 is smaller as compared with the CDROM. When the mask ROM is employed in order to compensate for the disadvantages of the CDROM, therefore, the cost is increased. In order to replace the CDROM by the mask ROM, therefore, it is necessary to implement a mask ROM system semiconductor memory of a low cost. In other words, it is inevitably necessary to reduce the chip area of such a mask ROM system semiconductor memory.

SUMMARY OF THE INVENTION

According to the present invention, a semiconductor memory device comprises a memory cell array which is provided with a plurality of memory cells, addresses means for making addressing for accessing the memory cell array, data output means for outputting data of the memory cells which are addressed by the addressing means to the exterior, and a common pad for external connection for inputting address information from the exterior and outputting the data from the memory cells to the exterior, and the addressing means includes an address input circuit for incorporating the address information from the exterior in an initial access in a plurality of continuous accesses, an initial addressing part for receiving the address information which is incorporated in the address input circuit and making addressing corresponding to the address information, and an address change part for receiving a timing signal from the exterior in a second or later access in the plurality of continuous accesses for changing addresses in synchronization with the timing signal, while the data output means has a function of supplying the data of the memory cells corresponding to addresses which are specified by the addressing means to the common pad at prescribed timing after the address information is incorporated in the address input circuit from the common pad.

Preferably, the address change part includes a counter for adding or subtracting the addresses which are specified by the initial addressing part "1" by "1" in accordance with timing of the timing signal.

Preferably, a plurality of the memory cells are arranged in a plurality of columns and a plurality of rows in the memory cell array, the memory cell array is provided with a first decoding circuit for specifying column-directional addresses of the memory cell array and a second decoding circuit for specifying row-directional addresses of the memory cell array, the counter consists of a lower bit portion for outputting lower bit data of the added or subtracted data and an upper bit portion for outputting upper bit data of the added or subtracted data, the lower bit portion is connected to either first or second decoding circuit, and the upper bit portion is connected to the remaining one of the first and second decoding circuits.

Preferably, a control signal serving both as the timing signal for changing the addresses in the address change part and the prescribed timing signal for supplying the data of the memory cells to the common pad by the data output means is inputted from the exterior.

In the semiconductor memory device according to the present invention, the common pad serves both as an address input pad and a data output pad, whereby it is possible to reduce the number of pads in this semiconductor memory device. Thus, it is also possible to reduce the numbers of bonding wires, lead frames and external connection pins which are connected to the common pad, thereby remarkably improving the overall area efficiency.

Further, the semiconductor memory device according to the present invention includes the counter for adding or subtracting the addresses "1" by "1" as the address change part, whereby it is possible to transmit the addresses in a simple structure.

In the semiconductor memory device according to the present invention, lower bit data of the added or subtracted data are outputted to either the first or second decoding circuit by the lower bit portion and upper bit data are outputted to the other one of the first and second decoding circuits by the upper bit portion, whereby it is possible to arbitrarily specify the addresses in an initial access through a relatively simple operation with simple control, as well as to reduce an address transition time.

In the semiconductor memory device according to the present invention, the timing signal for changing the addresses by the address change part and the prescribed timing for supplying the data of the memory cells to the common pad by the data output means are controlled by a single control signal, whereby it is possible to reduce the number of terminals by singularizing inputs of the timing signals for attaining miniaturization, as well as to prevent such an error in operation order that data are outputted after address change.

Accordingly, an object of the present invention is to provide a semiconductor memory device employing a storage element such as a mask ROM (semiconductor memory) which is excellent in area efficiency and at a relatively low cost in place of a CDROM.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5 illustrates symbols, concrete numerical values and units of various operating times in the semiconductor memory device according to the first embodiment of the present invention;

FIG. 7 illustrates results of comparison of processing speeds in the first embodiment and second prior art;

DESCRIPTION OF THE PREFERRED EMBODIMENTS

Figure 1:
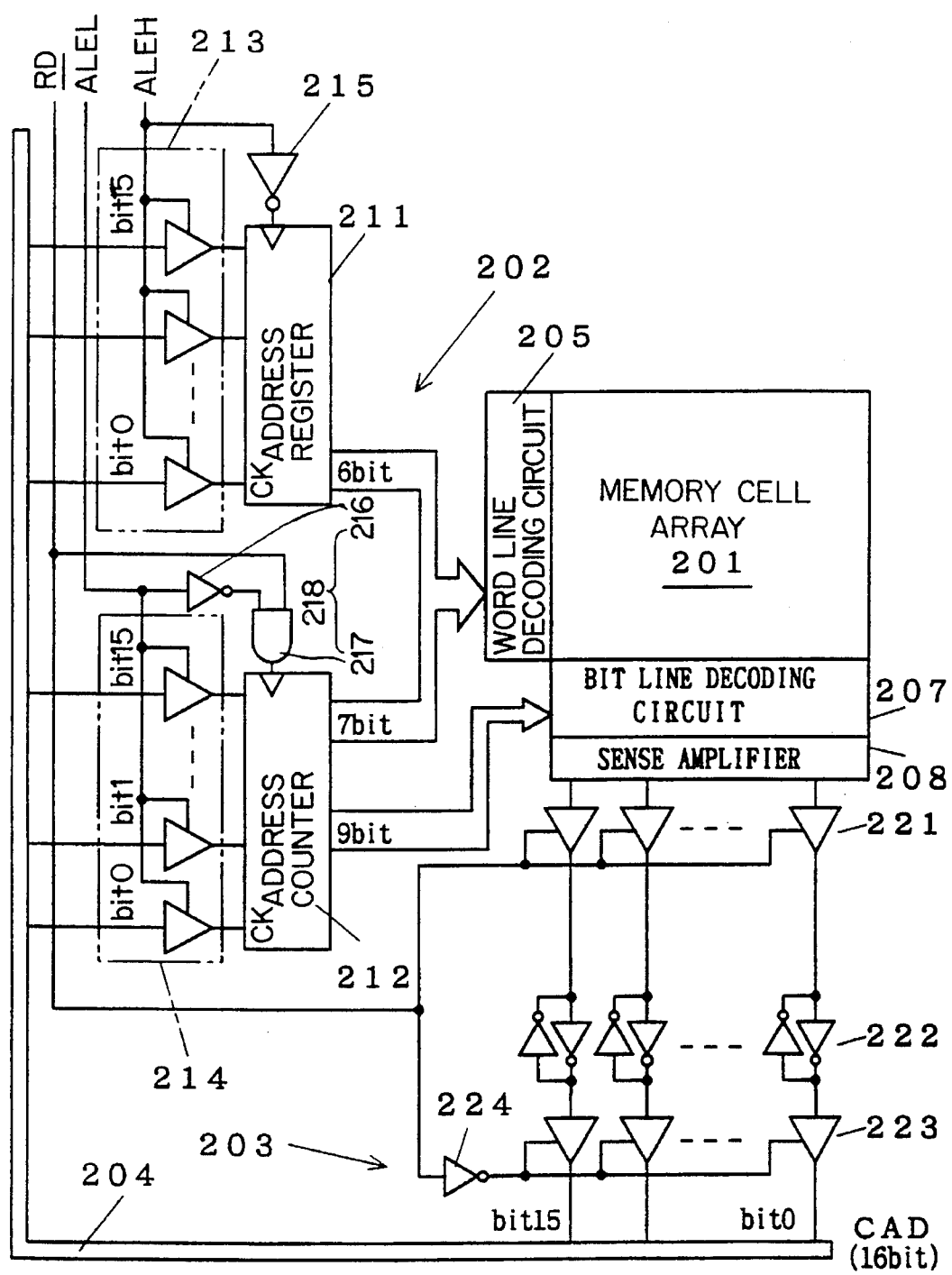
FIG. 1 illustrates a semiconductor memory device according to a first embodiment of the present invention.

FIG. 1 is a circuit block diagram showing a semiconductor memory device according to a first embodiment of the present invention. The semiconductor memory device according to this embodiment is a 64-megabit mask ROM device, for example, which comprises a memory cell array 201 provided with a plurality of memory cells, addressing means 202 (address latch circuit) for carrying out addressing for accessing the memory cell array 201, data output means 203 for outputting data of memory cells which are addressed by the addressing means 202 to the exterior, a common pad (CAD) 204 for external connection for inputting address information (head address) from the exterior in an initial access and thereafter outputting data to the exterior, and three input pins which are supplied with an ALEH signal (address latch enable high signal), an ALEL signal (address latch enable low signal) and a read (/RD) signal. Among these signals, the read (/RD) signal serves as a timing signal for changing addresses by an address counter 212, as well as prescribed timing for supplying data of the memory cell array 201 to the common pad 204.

Figure 2:
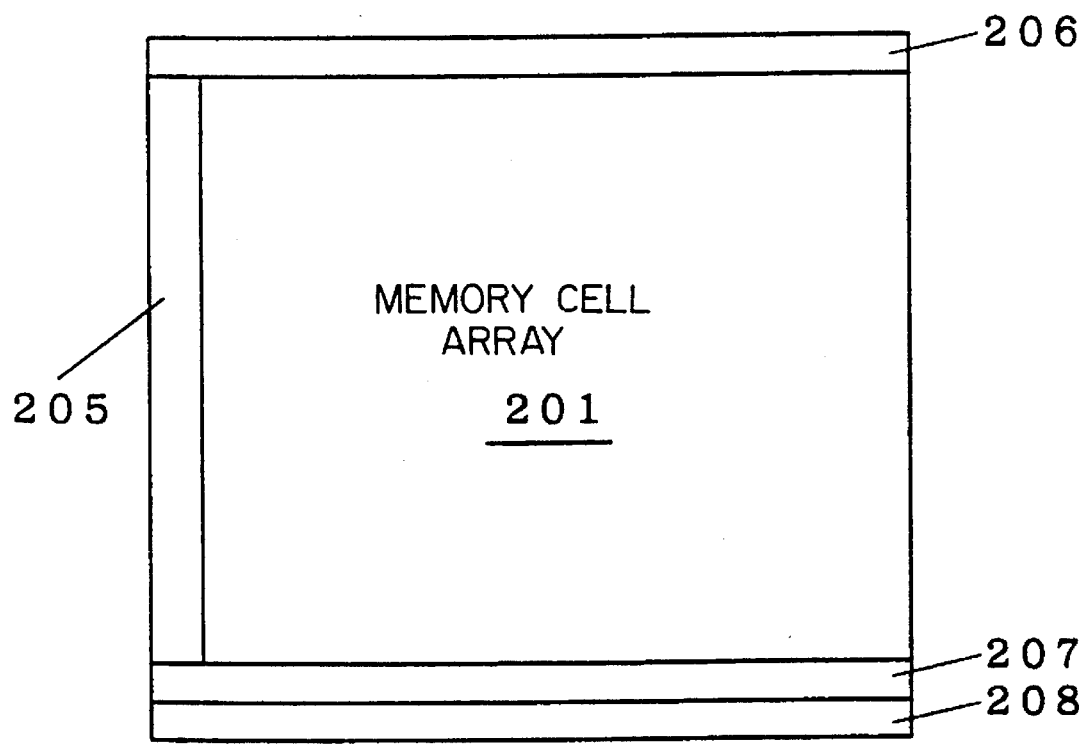
FIG. 2 illustrates a memory cell provided in the semiconductor memory device according to the first embodiment of the present invention.

The memory cell array 201 comprises $2^{13}$ word lines, $2^{13}$ bit lines, and a plurality of memory cells which are formed on intersections therebetween respectively, for example. Referring to FIG. 2, numeral 205 denotes a word line decoding circuit (first decoding circuit), numeral 206 denotes a word line predecoding circuit, numeral 207 denotes a bit line decoding circuit (second decoding circuit), and numeral 208 denotes a sense circuit for amplifying the potential amplitude of an output. In view of the aforementioned numbers of the word lines and the bit lines, the number of addresses for the word line decoding circuit 205 is 13, while that of addresses for the bit line decoding circuit 207 is 9.

The addressing means 202 (address latch circuit) comprises an address register 211 (initial addressing part) which receives the address information (head address) from the exterior in the initial access for carrying out addressing in correspondence to the address information, an address counter 212 (address change part) which receives the head address while receiving the external timing signal in a next or later access for adding (incrementing) addresses specified by the external address information in the initial access "1" by "1" in accordance with timing of the timing signal for carrying out addressing, a first buffer circuit 213 (address input circuit) for making buffer input in the address register 211, and a second buffer circuit 214 (address input circuit) for making buffer input in the address counter 212.

The address register 211, being a flip-flop of a 16-bit (bit0 to bit15) structure, for example, receives the ALEH signal of a TTL level which is applied from the exterior through an inverter 215. Thus, data from the common pad 204 are inputted in the address register 211 at a trailing edge clock of the ALEH signal. Among 16-bit output data of the address register 211, lower 6 bits are inputted in the word line decoding circuit 205. According to this embodiment, outputs of upper 10 bits of the address register 211 are not employed in a mask ROM of higher capacity, however, it is preferable to employ such output data.

The address counter 212 is a binary up-counter (1-bit adder) having 16-bit (bit0 to bit15) input terminals, for example, and the 16-bit data input terminals of this address counter 212 are connected to the common pad 204. A clock input terminal of the address counter 212 is connected to a clock input circuit 218 which is formed by an inverter 216 and an AND circuit 217. The inverter 216 of this clock input circuit 218 receives the ALEL signal of a TTL level which is applied from the exterior, for inverting and outputting the same. Further, the AND circuit 217 of the clock input circuit 218 has two input terminals, so that the externally applied read (/RD) signal is received in one of these input terminals and an output signal from the inverter 216 is received in the other input terminal. Thus, the address counter 212 receives the data from the common pad 204 at a trailing edge clock of the ALEL signal, while the data are counted up (incremented) at a trailing edge clock of the read (/RD) signal. Data (lower 9 bit data) from the portion (lower bit portion) for outputting lower 9 bits among the 16-bit outputs of the address counter 212 are transmitted to the bit line decoding circuit 207, while data (upper 7 bit data) from the portion (upper bit portion) for outputting upper 7 bits are transmitted to the word line decoding circuit 205. Change of the incremented data is mainly reflected as that of the lower 9-bit data to the bit line decoding circuit 207, while the upper 7-bit data to the word line decoding circuit 205 are incremented by "1" and all bits of the lower 9 bit data become "0" when all bits of the 9-bit data become "1". This means that memory cells in a row corresponding to a subsequent word line are read after memory cells in a row corresponding to a certain word line are completely read out.

The first buffer circuit 213 is adapted to convert data received from the common pad 204 to signals suitable for the address register 211 at timing which is synchronous with the externally applied ALEH signal of the TTL level, and is formed by 16 inverters corresponding to the bit number of the address register 211, so that each inverter converts the signal from the common pad 204 to a buffer signal by the ALEH signal and transmits the same to the address register 211.

The second buffer circuit 214 is adapted to convert data received from the common pad 204 to signals suitable for the address counter 212 at timing which is synchronous with the externally applied ALEL signal of a TTL level, and is formed by 16 inverters corresponding to the bit number of the address counter 212, so that each inverter converts the signal from the common pad 204 to a buffer signal by the ALEL signal and transmits the same to the address counter 212.

The data output means 203 comprises buffers 221 (tristate buffers) which are connected to the 16 output terminals of the sense circuit 208 respectively for outputting output signals only when the read (/RD) signal is at a high level, latch circuits 222 which are switched between high and low levels in response to the output signals from the respective buffers 221 for latching the output signals from the respective buffers 221, output buffer circuits 223 for outputting signals from the respective latch circuits 222 to the common pad 204 when the read (/RD) signal goes low, and an inverter 224 serving as a trigger for the output buffer circuits 223. Due to the structure, the output buffer circuits 223 stop output operations while the buffers 221 output the data to the latch circuits 222, and output operations of the buffers 221 are stopped while the output buffer circuits 223 output the data from the latch circuits 222.

Figure 3:
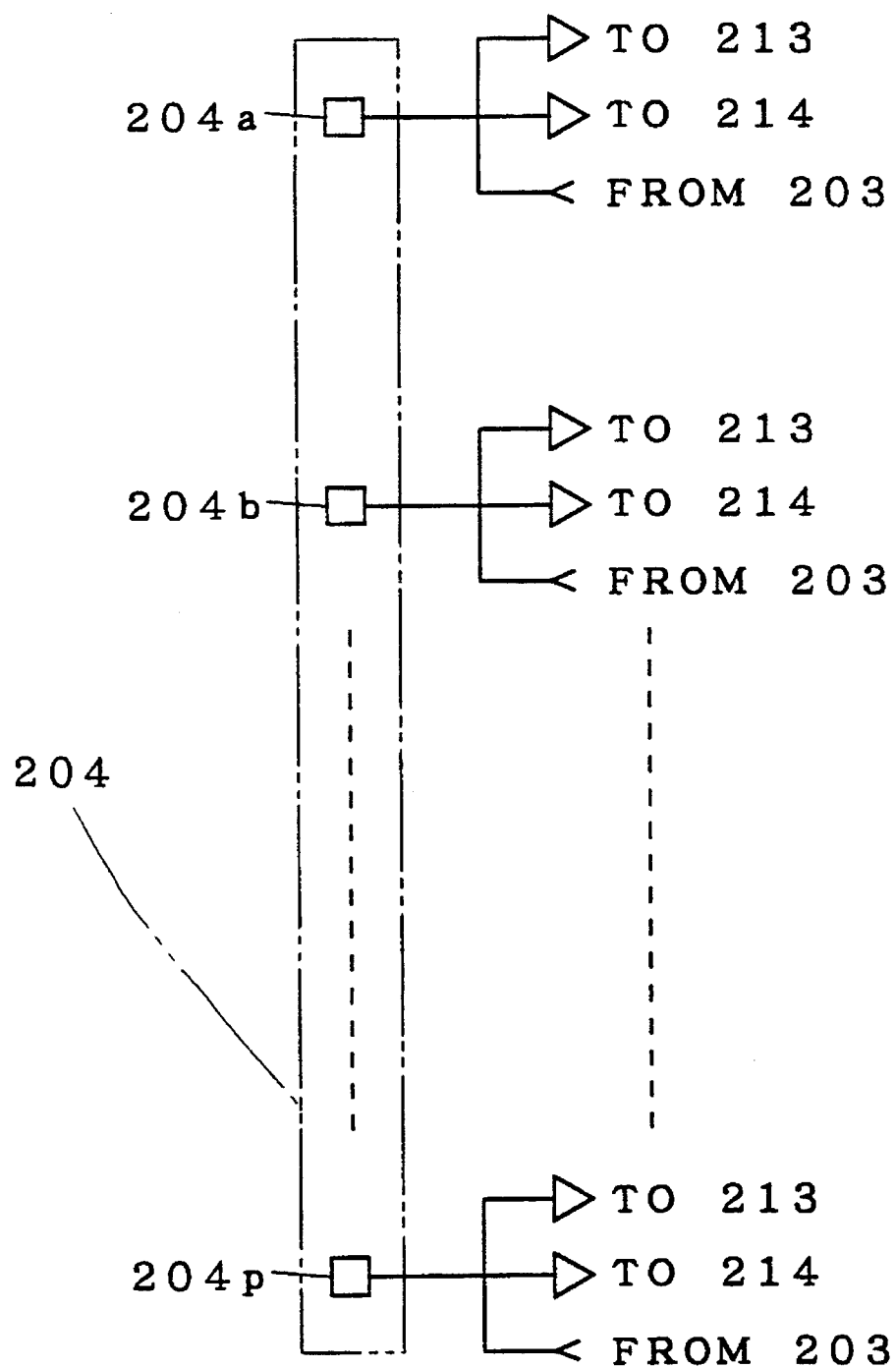
FIG. 3 illustrates the structure of input/output pins provided in a chip of the semiconductor memory device according to the first embodiment of the present invention.

The common pad 204 (CAD), which is adapted to input 16-bit addresses (combinations of high and low levels) and output 16-bit data, has 16 pads 204a to 204p as shown in FIG. 3. The pads 204a to 204p of this common pad 204 are connected to the address register 211 and the address counter 212 through the first and second buffer circuits 213 and 214 respectively, as well as to the respective output buffer circuits 223 of the data output means 203.

Figure 4:
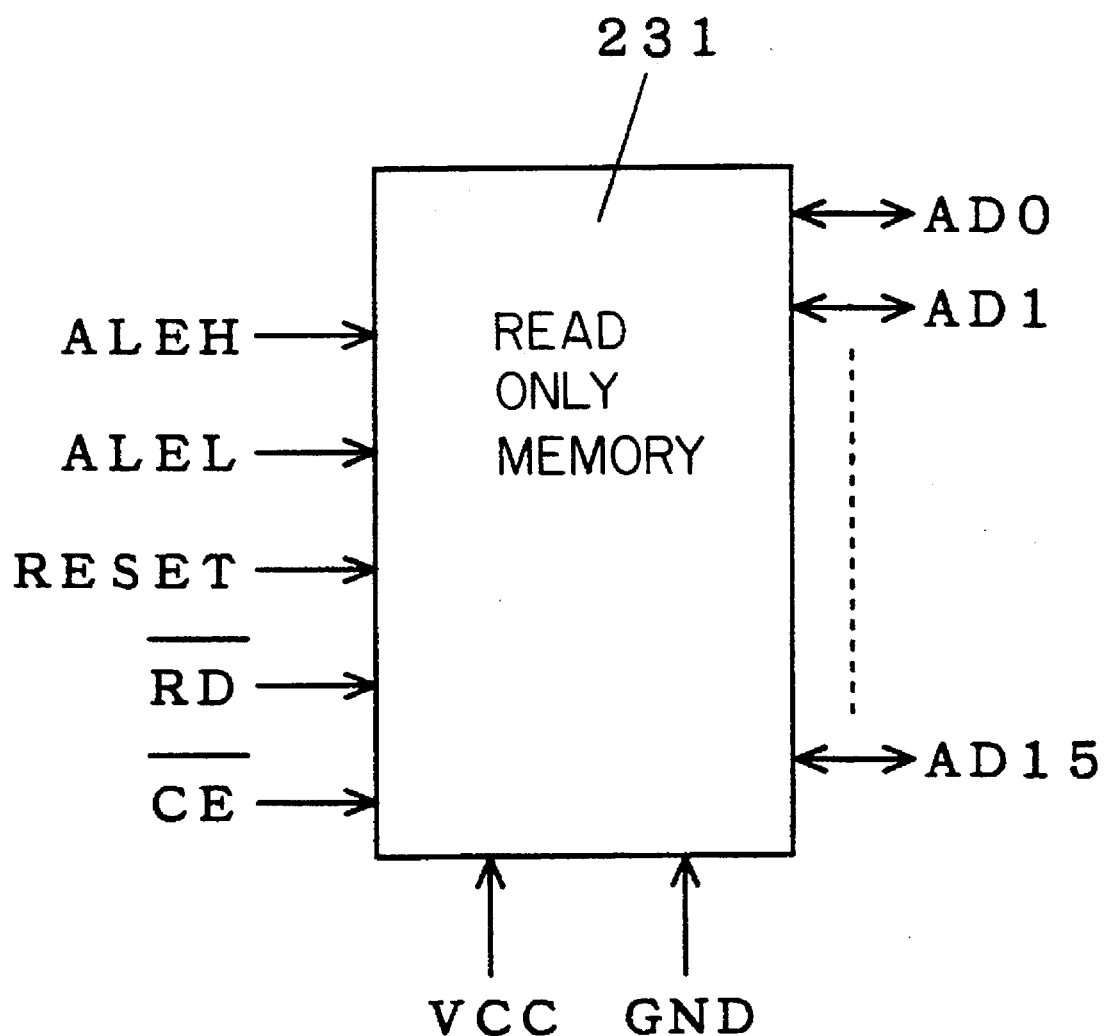
FIG. 4 illustrates the structure of the input/output pins provided in the chip of the semiconductor memory device according to the first embodiment of the present invention.

The circuit shown in FIG. 1 is integrated as a single chip 231, as shown in FIG. 4. Referring to FIG. 4, symbol /CE denotes a chip enable signal, symbol Vcc denotes a power source of about 3.3 V, for example, and symbol GND denotes the ground, which are omitted in FIG. 1 for the purpose of convenience. Symbols AD0, AD1, . . . , AD15 denote I/O pins serving as 16 terminals of the common pad 204. As shown in FIG. 4, address input pins in an initial access and subsequent data output pins are employed in common in the common pad 204 according to this embodiment, whereby the numbers of these pins and lead frames for connecting the pins with the chip 231 can be halved to implement remarkable area reduction of the overall semiconductor memory device.

Operations of the semiconductor memory device having the aforementioned structure are now described. Continuous reading (address incrementation) in a prescribed sector is called an in-sector access, and reading of head address data in continuous reading is called a sector access. As shown in FIG. 5, further, an address setup time is denoted by tAS (15 ns at the minimum), an address hold time is denoted by tAH (5 nm at the minimum), a latency time (sector sequential access time) from the ALEL signal to the read (/RD) signal is denoted by tL (2 μs at the minimum), an in-sector read cycle time is denoted by tCYC (400 nm at the minimum), and a read (/RD) signal access time is denoted by tRD (70 nm at the maximum).

Figure 6:
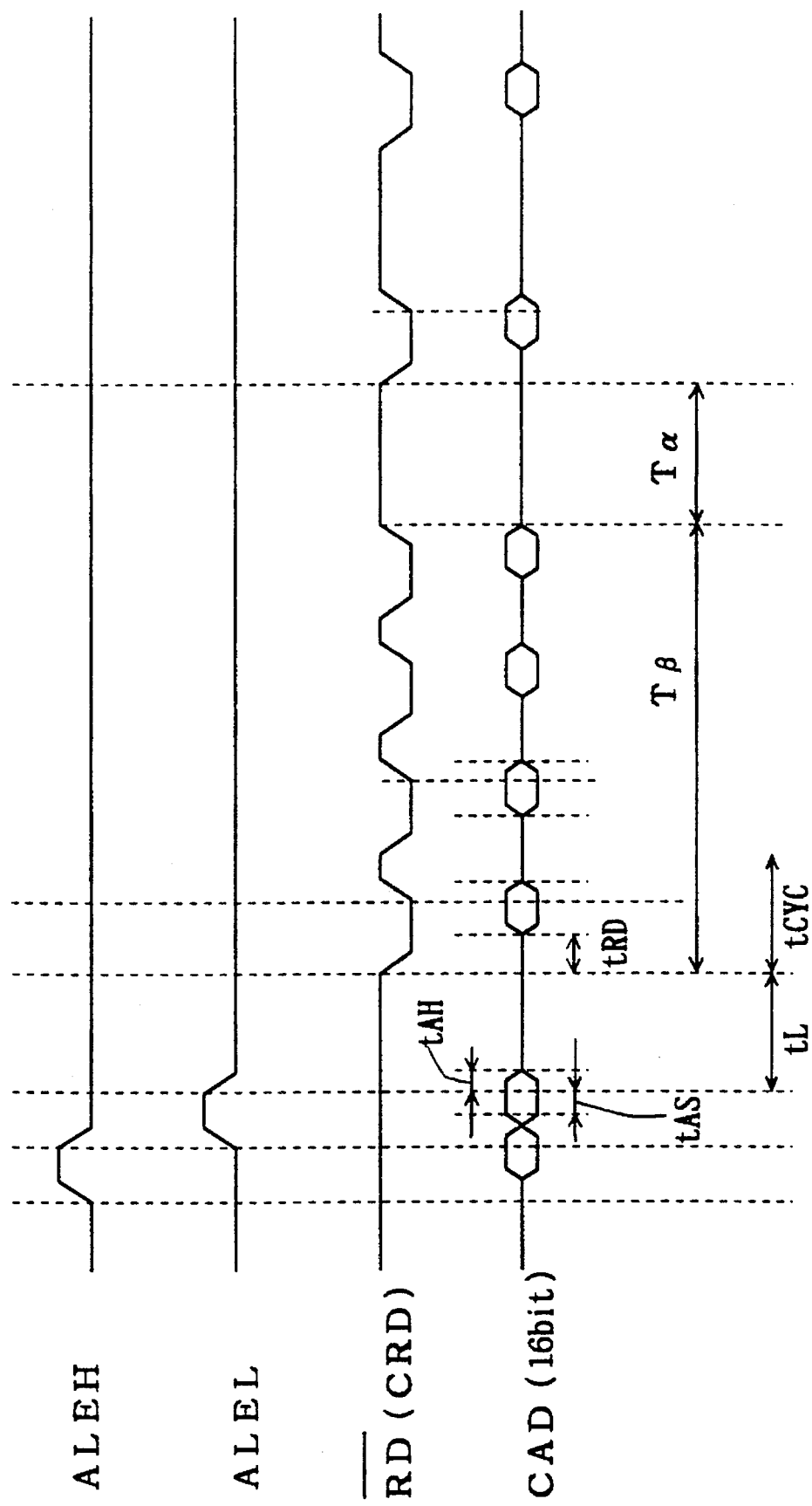
FIG. 6 is a timing chart showing operations of the semiconductor memory device according to the first embodiment of the present invention.

As shown in a timing chart of FIG. 6, the ALEH signal is first inputted in the initial access and then the ALEL signal inputted, whereby the address register 211 receives the head address data from the common pad 204 at the trailing edge clock of the ALEH signal while the address counter 212 receives the head address data from the common pad 204 at the trailing edge clock of the ALEL signal. Then, the lower 6 bits of the 16-bit output data of the address register 211 and the upper 7 bits of the 16-bit outputs of the address counter 212 are transmitted to the word line decoding circuit 205. Further, the lower 9 bits of the address counter 212 are transmitted to the bit line decoding circuit 207. The word line decoding circuit 205 specifies a word line of the memory cell array 201 from the total 13-bit address data as received, while the bit line decoding circuit 207 specifies a bit line of the memory cell array 201 from the 9-bit address data as received. Thus, the head address in the initial access is specified.

After a lapse of the latency time tL, the read (/RD) signal goes low as shown in FIG. 6, whereby the data of the memory cell accessed in the memory cell array 201 are outputted to the common pad 204 through the sense circuit 208 and the data output means 203.

An output operation of the data output means 203 is as follows: First, the read (/RD) signal is transmitted to the inverter 224, serving as a trigger for the output buffer circuits 223, and the buffers 221. When the read (/RD) signal is at a high level, the buffers 221 latch the output data of the sense circuit 208 in the latch circuits 222. At this time, the output buffer circuits 223 output no data to the common pad 204 (high impedance state). When the read (/RD) signal is at a low level, on the other hand, the sense circuit 208 and the latch circuits 222 are electrically disconnected from each other. At this time, the output buffer circuits 223 output data to the common pad 204.

Thus, the output of the sense circuit 208 is not directly electrically connected with the common pad 204, whereby no erroneous data are outputted from the common pad 204 while address data are changed in the chip interior to ascertain the output data, and hence no malfunction is caused in the semiconductor memory device according to this embodiment with no specific timing control. In order to provide the semiconductor memory device according to the first prior art with a function similar to that of this embodiment, on the other hand, the latch circuits 222 of this embodiment must be formed by relatively complicated circuits such as flip-flop circuits, and hence the circuit scale is increased leading to increase in chip size. Since the output of the sense circuit 208 is not directly electrically connected with the common pad 204 as described above, no problem of ground bounds is caused dissimilarly to the conventional output circuit. Thus, the output circuit is simplified in structure as compared with the prior art, whereby it is possible to reduce the chip size.

In the aforementioned output operation, the address counter 212 counts up (increments) data by "1" in synchronization with the read (/RD) signal on a trailing edge of the read (/RD) signal. The address counter 212 further reads data of memory cells corresponding to the incremented addresses when the read signal (/RD) goes low next time. Thereafter data are sequentially read every time the read (/RD) signal goes low. The read cycle (in-sector read cycle) time tCYC, which is 400 nm at the minimum as shown in FIG. 5, is extremely higher than the latency time (sector sequential access time) tL. Assuming that one sector is formed by 256 words (512 bytes), for example, a cycle time of the latency time (sector sequential access time) tL is necessary if reading extends over the sector as shown at Tα in FIG. 6. This is because it is necessary to wait for a time required for a word line to be decoded to rise, since the upper bits of the address counter 212 are employed for decoding the word line. When data are sequentially read in the sector as shown at Tβ, on the other hand, only decoding of the bit line is changed. Namely, the word line is fixed. Thus, it is possible to implement a high-speed access (in-sector read cycle time tCYC).

Thus, it is possible to implement a high-speed sequential access of the in-sector read cycle time tCYC=400 nm while minimizing the chip size. FIG. 7 shows speeds of sector accesses (Tα) and in-sector accesses Tβ in the CDROM according to the second prior art and the semiconductor memory device (mask ROM) according to this embodiment in comparison. Referring to FIG. 7, CASE1 and CASE2 show the CDROM according to the second prior art and the semiconductor memory device (mask ROM) according to this embodiment respectively. According to this embodiment, it is possible to attain an access speed of at least 20 times that of the second prior art. In this embodiment, it is possible to attain the access speed of at least 20 times that of the second prior art as shown in FIG. 7, even if the number of block division for attaining a high speed or the number of word line decoding circuits is reduced in the first prior art. Thus, it is possible to reduce the area of the memory cell array 201 for attaining miniaturization.

Figure 8:
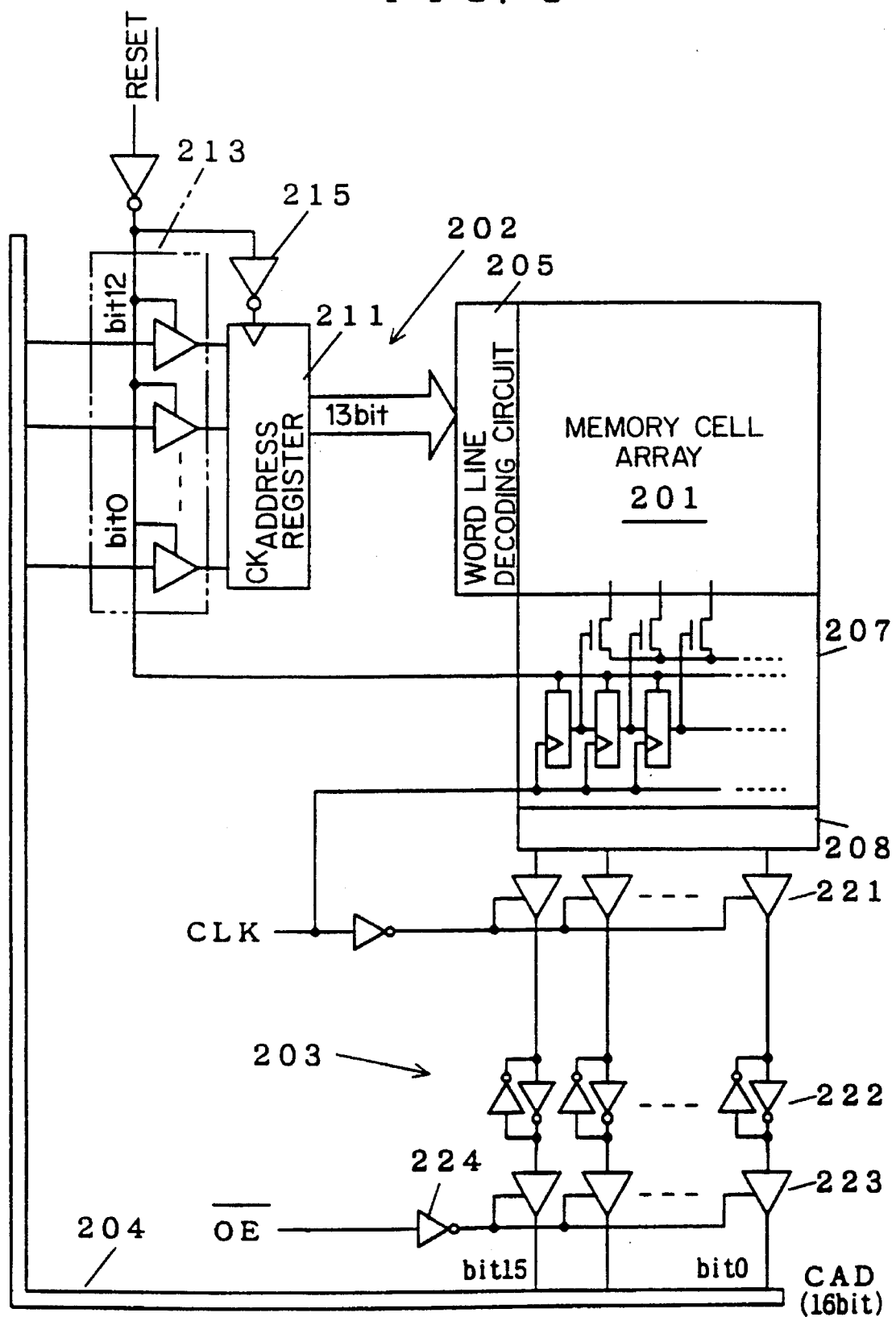
FIG. 8 illustrates a semiconductor memory device according to a second embodiment of the present invention.
Figure 9:
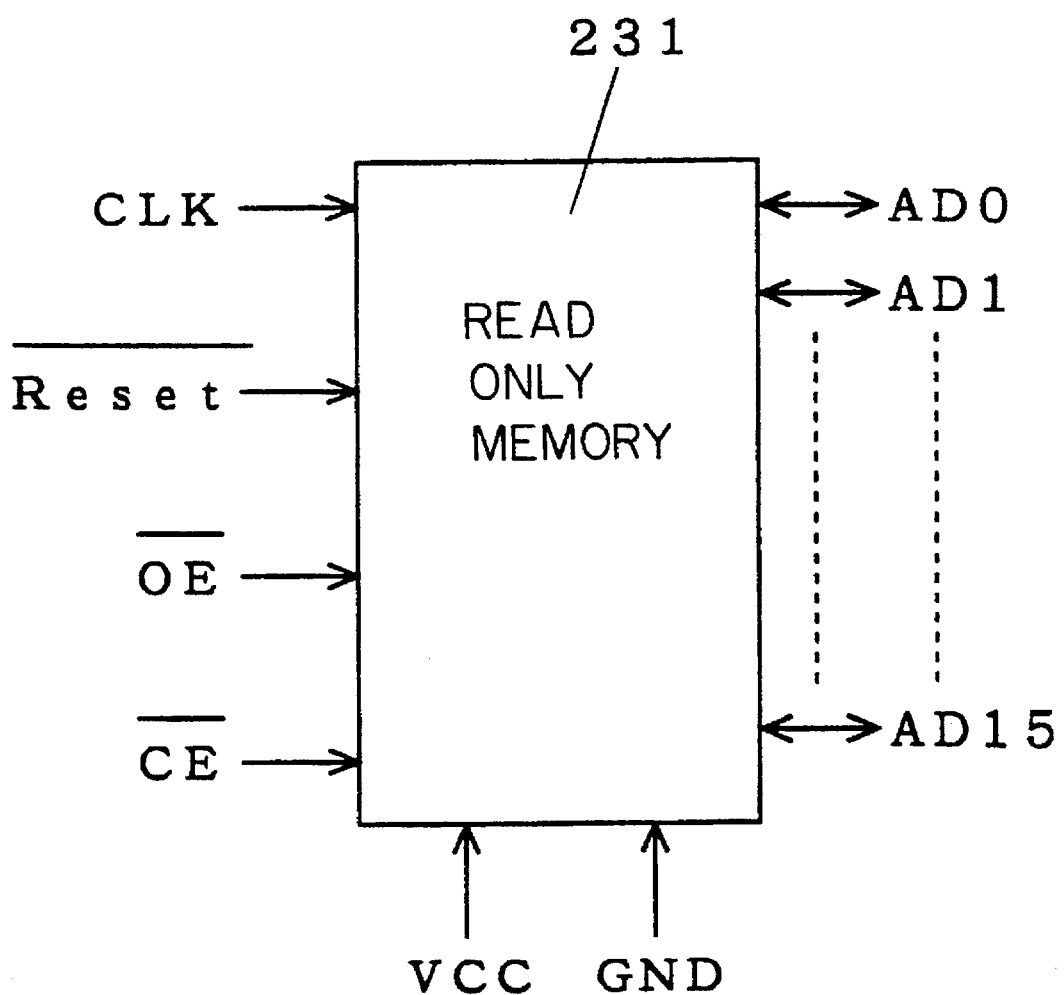
FIG. 9 illustrates the structure of input/output pins provided in a chip of the semiconductor memory device according to the second embodiment of the present invention.

FIG. 8 illustrates a semiconductor memory device according to a second embodiment of the present invention. In the semiconductor memory device according to this embodiment, an address register 211 of a 13-bit structure, for example, is employed as an initial addressing part for making addressing in an initial access similarly to the address register 211 provided in the first embodiment as to addressing means 202 for addressing memory cells to be accessed, while a shift register carrying out a shift operation every time a clock (CLK) signal is received is employed as an address change part for changing and specifying addresses in a second or later access. While the structure of a memory cell array 201 provided in this embodiment is similar to that of the first embodiment shown in FIG. 2, the aforementioned shift register for serving as the address change part is employed as the bit line decoding circuit 207 shown in FIG. 2. The address counter 212 and the second buffer circuit 214 (see FIG. 1) described with reference to the first embodiment are omitted in this embodiment. Further, an output bit number of the initial addressing part (address register 211) described with reference to the first embodiment is assumed to be 13 when the number of word lines is 13, for example, so that such 13-bit data are transmitted to only a word line decoding circuit 205. The remaining structure of this embodiment is similar to that of the first embodiment, particularly in a point that both of the initial addressing part (address register 211) and data output means 203 are connected to a common pad 204. FIG. 9 illustrates a chip 231 according to this embodiment. Referring to FIG. 9, symbol CLK denotes the clock signal, symbol/Reset denotes a rest signal and symbol/OE denotes an output enable signal, while the other portions have functions which are similar to those in the first embodiment, and are denoted by the same symbols.

Figure 10:
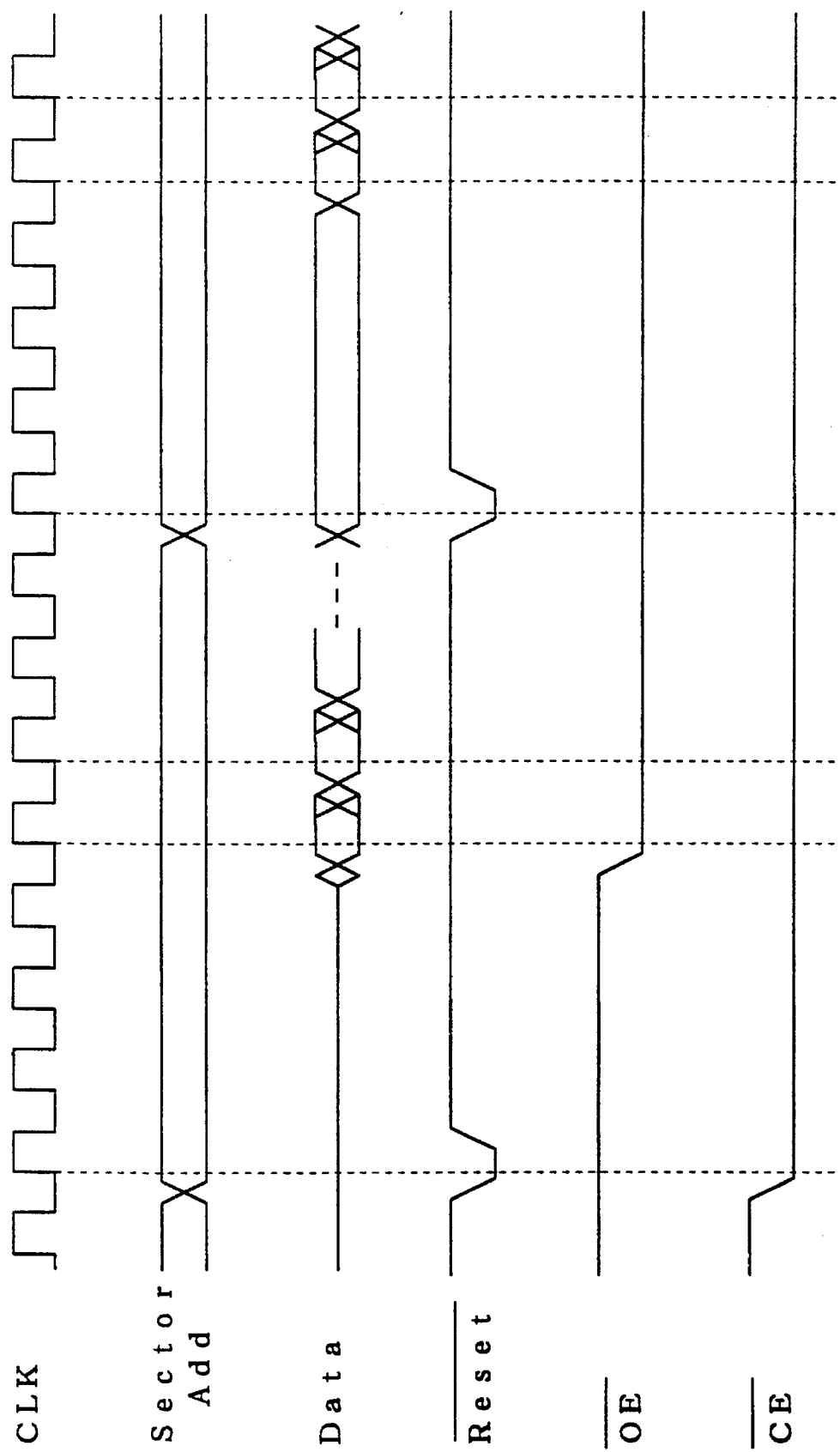
FIG. 10 is a timing chart showing operations of the semiconductor memory device according to the second embodiment of the present invention.
Figure 11:
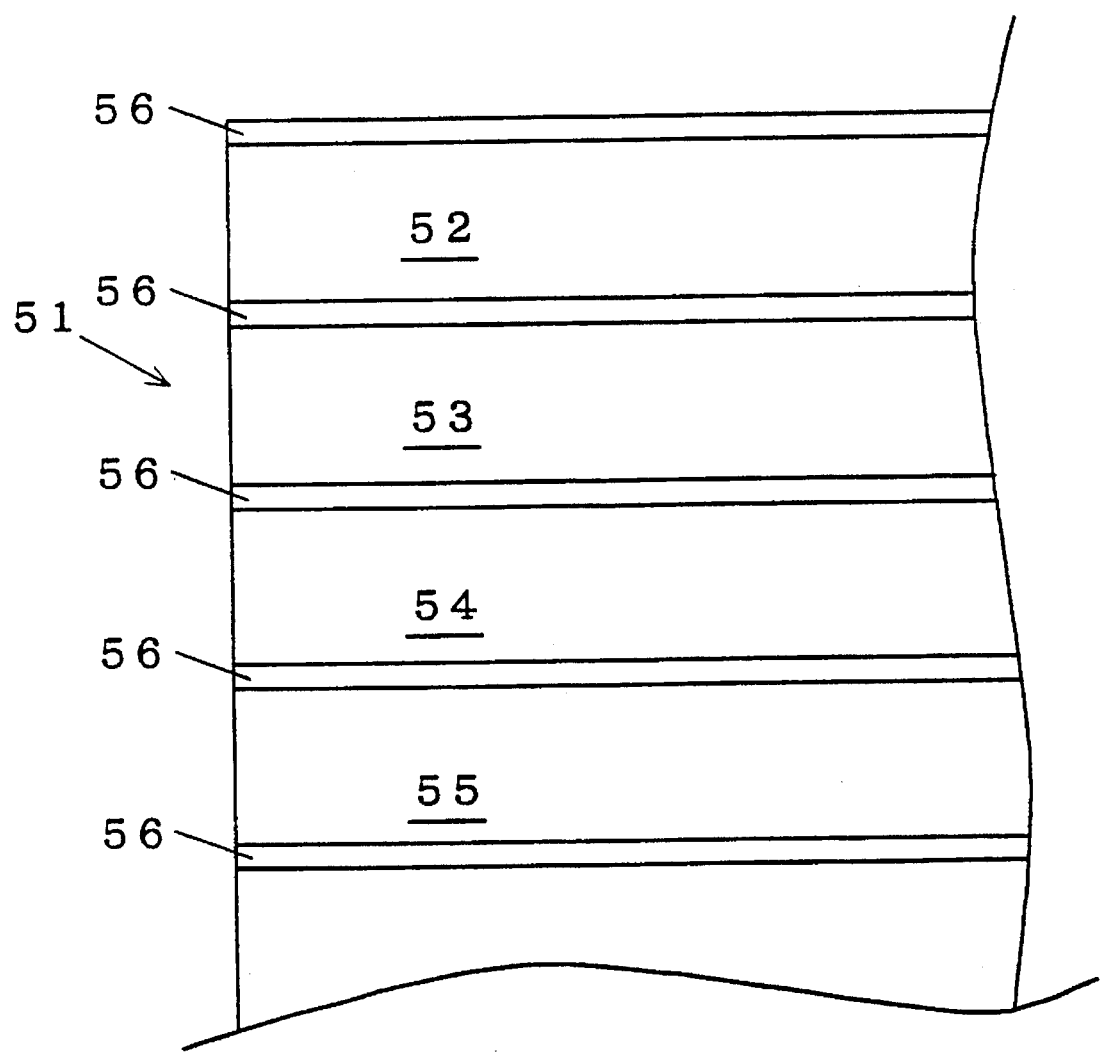
FIG. 11 is a layout diagram schematically showing a memory cell block provided in a semiconductor memory device according to first prior art.
Figure 12:
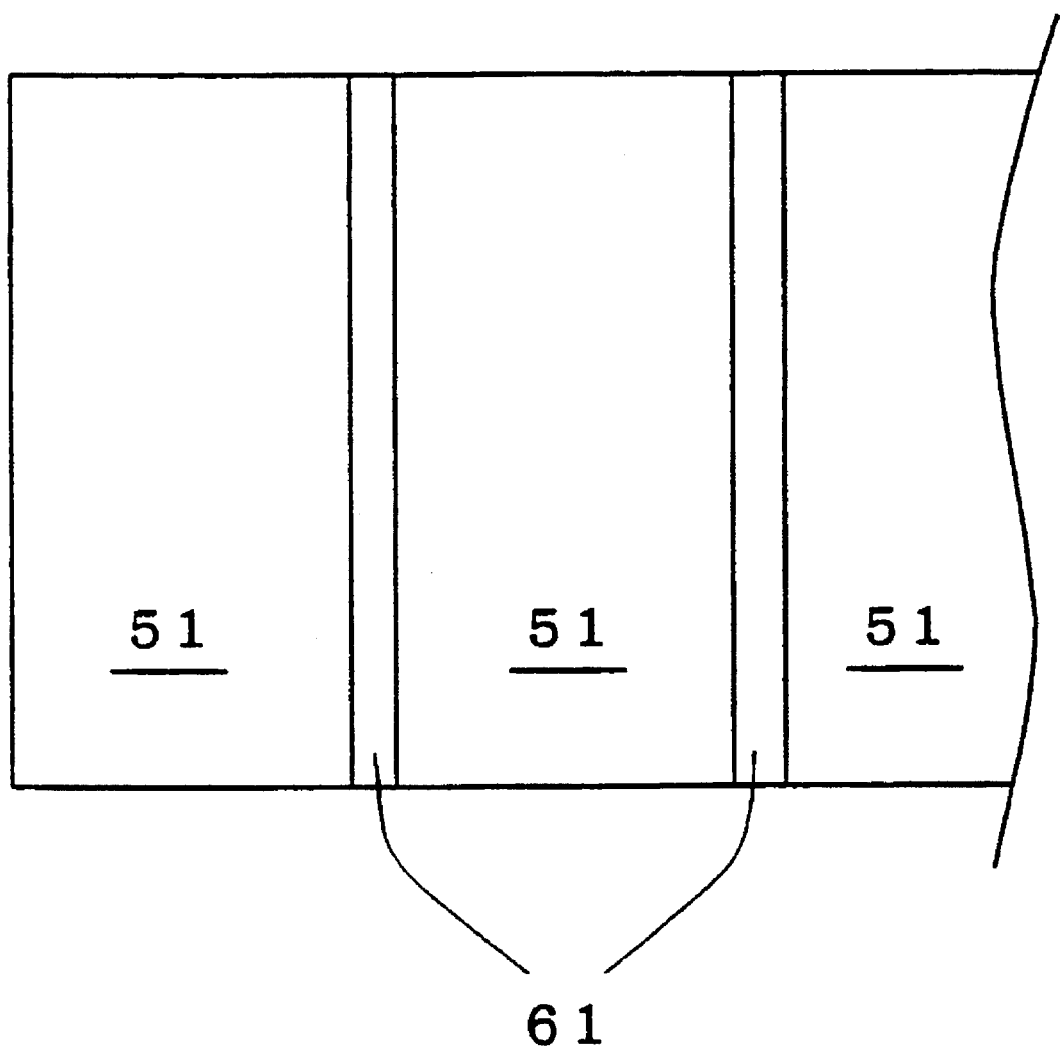
FIG. 12 is a layout diagram schematically showing memory cells provided in the semiconductor memory device according to the first prior art.
Figure 13:
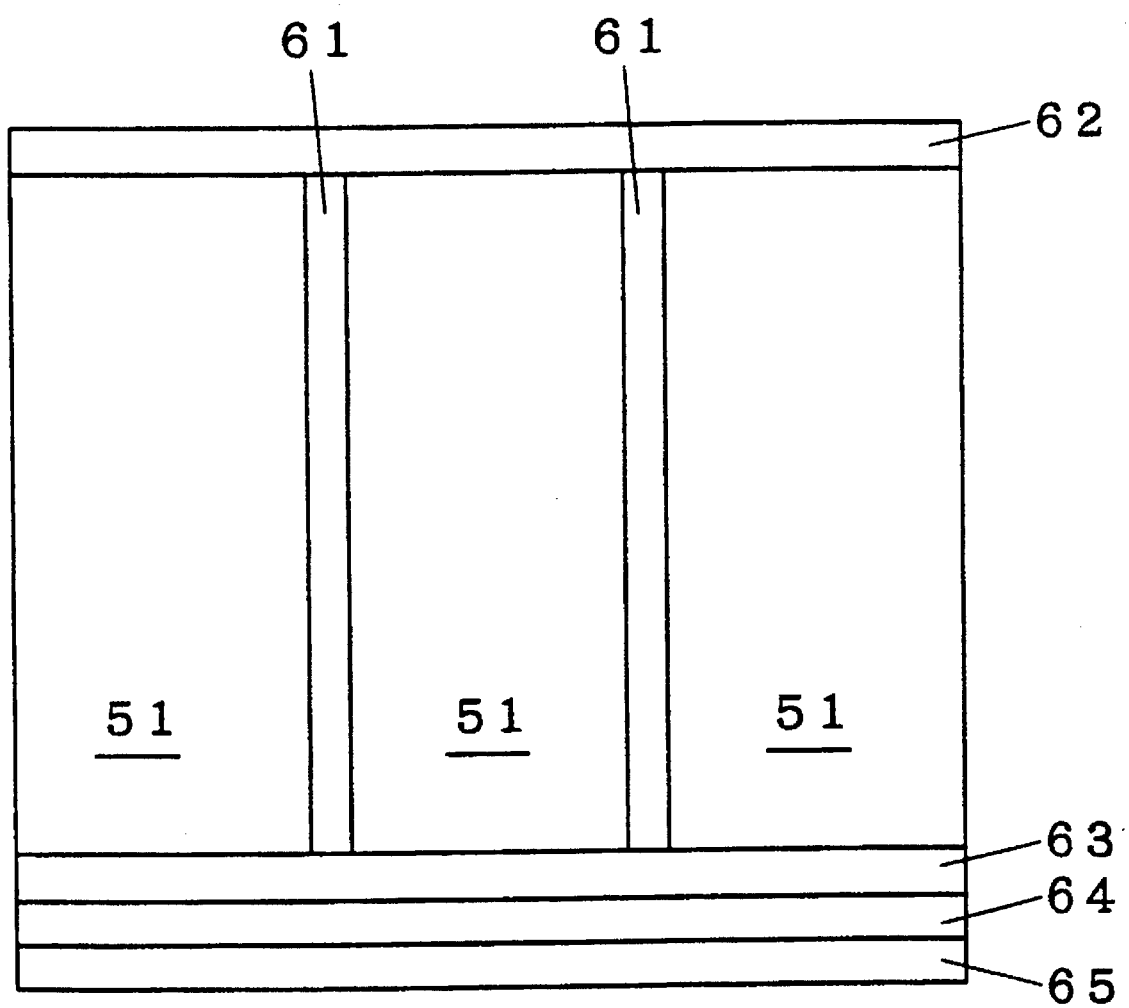
FIG. 13 is a block diagram schematically showing the semiconductor memory device according to the first prior art.
Figure 14:
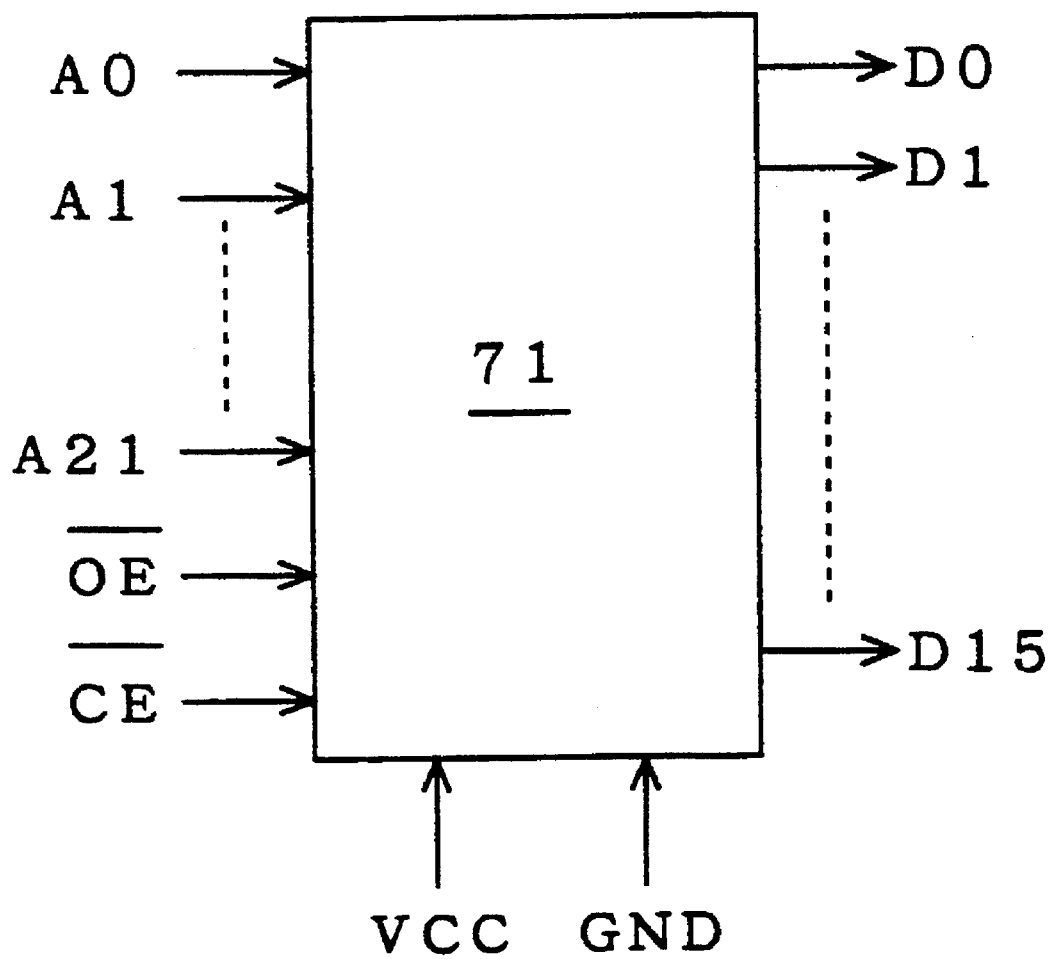
FIG. 14 illustrates the structure of input/output pins provided in a chip of the semiconductor memory device according to the first prior art.
Figure 15:
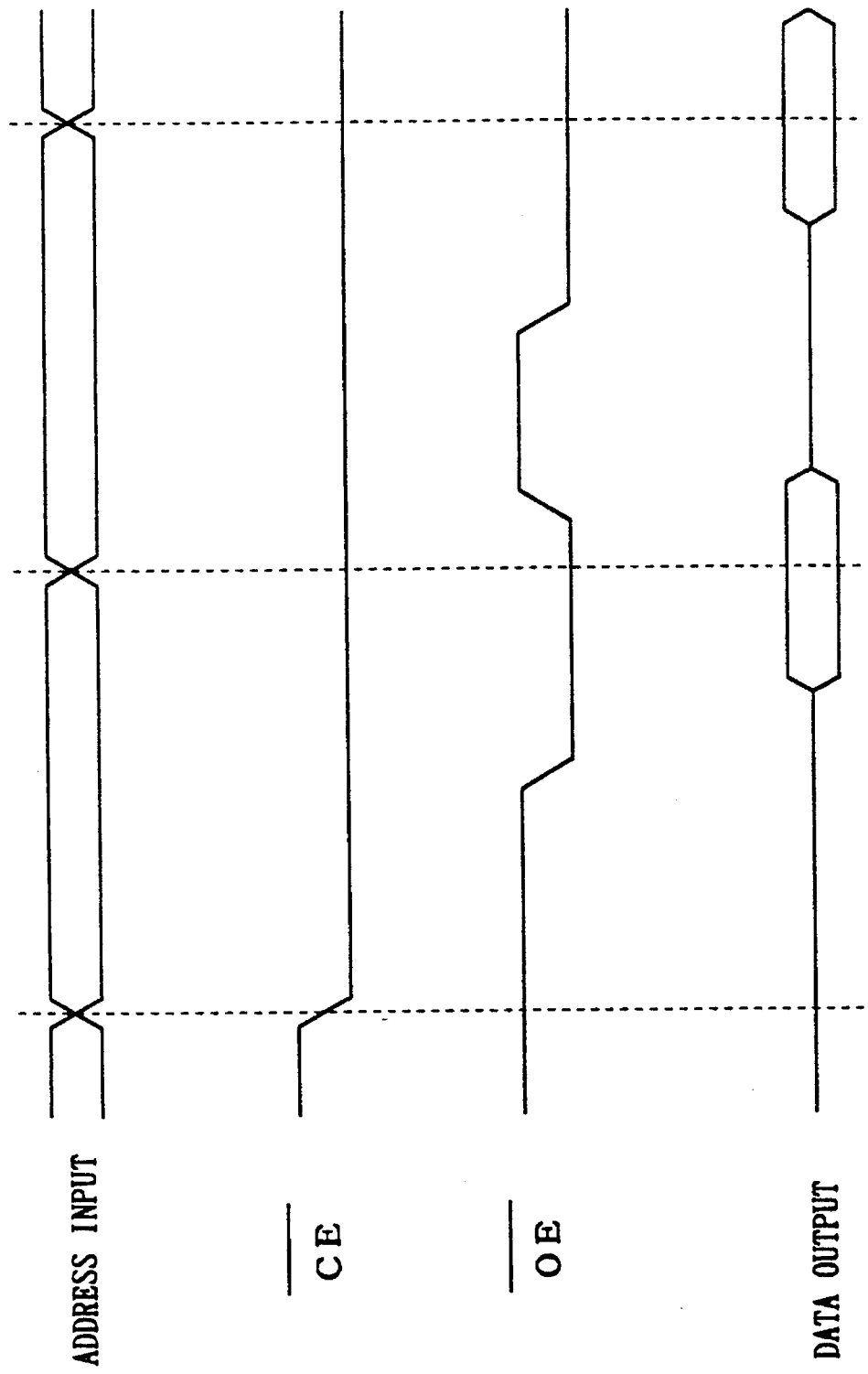
FIG. 15 is a timing chart showing signals in respective parts of the first prior art.

The operation of the semiconductor memory device having the aforementioned structure is now described. First, address data are inputted through AD0 to AD15 while the reset (/Reset) signal is simultaneously inputted in an initial access. Then, the initial addressing part (address register 211) makes addressing and a word line decoding circuit 205 specifies a specified word line, similarly to the first embodiment shown in FIG. 2. At this time, the bit line decoding circuit 207 which is formed by the shift register specifies the least significant bit by the reset signal. When the clock (CLK) signal is inputted in the chip 231, the output of the bit line decoding circuit 207 is transversely shifted in synchronization with the clock (CLK) signal. The bit line decoding circuit 207 sequentially selects bit lines of the memory cell array 201 transversely, to load data. FIG. 10 shows a timing chart for this operation. In this case, it is possible to remarkably reduce the numbers of address input and data output pads of the common pad 204 as well as lead frames and pins which are connected to the pads. While the first prior art requires 38 pins (42 pins in total with other control pins) including 22 pins A0 to A22 and 16 pins D0 to D15 as shown in FIG. 14 in relation to a 64-megabit memory, for example, the pin number may be set in correspondence to a larger one of the numbers of the address input pins and the data output pins in this embodiment. Assuming that the chip 231 of this embodiment has a sector number of 8 kilosectors and 512 in-sector words, only 13 address input pins are required. Therefore, common pins for address input and data output may be in correspondence to 16 pins which are required as data output pins, as shown in FIG. 9. Thus, it is possible to implement remarkable area reduction in the overall semiconductor memory device as compared with the semiconductor memory device according to the first prior art having 42 pins. Further, it is possible to omit the address counter 212 and the second buffer circuit 214 as compared with the first embodiment. In addition, the bit line decoding circuit 207 can be formed by a simpler shift register as compared with the first embodiment.

While the counter 212 provided in the first embodiment is adapted to add the addresses "1" by "1" in accordance with the timing of the timing (clock) signal, the same may alternatively be formed to subtract the addresses.

While the invention has been shown and described in detail, the foregoing description is in all aspects illustrative and not restrictive. It is therefore understood that numerous modifications and variations can be devised without departing from the scope of the invention.

What is claimed is:

1. A semiconductor memory device comprising:

a memory cell array being provided with a plurality of memory cells;

addressing means for making addresses for accessing said memory cell array;

data output means for outputting data of said memory cells being addressed by said addressing means to the exterior; and a common pad for external connection for inputting address information from the exterior and outputting said data from said memory cells to the exterior, said addressing means comprising:

an address input circuit for incorporating said address information from the exterior in an initial access in a plurality of continuous accesses, an initial addressing part for receiving said address information being incorporated in said address input circuit and making addresses corresponding to said address information, and an address change part for receiving a timing signal from the exterior in a second or later access in said plurality of continuous accesses for changing addresses in synchronization with said timing signal, said data output means having a function of supplying said data of said memory cells corresponding to addresses being specified by said addressing means to said common pad at prescribed timing after said address information is incorporated in said address input circuit from said common pad, wherein a control signal serving both as said timing signal for changing said addresses in said address change part and a prescribed timing signal for supplying said data of said memory cells to said common pad by said data output means is inputted from the exterior.

2. A semiconductor memory device comprising:

a memory cell array being provided with a plurality of memory cells;

addressing means for making addresses for accessing said memory cell array;

data output means for outputting data of said memory cells being addressed by said addressing means to the exterior; and a common pad for external connection for inputting address information from the exterior and outputting said data from said memory cells to the exterior, said addressing means comprising:

an address input circuit for incorporating said address information from the exterior in an initial access in a plurality of continuous accesses, an initial addressing part for receiving said address information being incorporated in said address input circuit and making addresses corresponding to said address information, and an address change part for receiving a timing signal from the exterior in a second or later access in said plurality of continuous accesses for changing addresses in synchronization with said timing signal, said data output means having a function of supplying said data of said memory cells corresponding to addresses being specified by said addressing means to said common pad at prescribed timing after said address information is incorporated in said address input circuit from said common pad, wherein said address change part includes a counter for adding or subtracting said addresses being specified by said initial address part "1" by "1" in accordance with timing of said timing signal.

3. The semiconductor memory device in accordance with claim 2, wherein a plurality of said memory cells are arranged in a plurality of columns and a plurality of rows in said memory cell array, said memory cell array being provided with a first decoding circuit for specifying column-directional said addresses of said memory cell array and a second decoding circuit for specifying row-directional said addresses of said memory cell array, said counter consisting of a lower bit portion for outputting lower bit data of said added or subtracted data and an upper bit portion for outputting upper bit data of said added or subtracted data, said lower bit portion being connected to either said first decoding circuit or said second decoding circuit, said upper bit portion being connected to the remaining one of said first and second decoding circuits.

* * * * *